(12) United States Patent
Agan et al.

(10) Patent No.: US 7,269,061 B2
(45) Date of Patent: Sep. 11, 2007

(54) MAGNETIC MEMORY

(75) Inventors: Tom Allen Agan, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 0 days.

(21) Appl. No.: 11/549,247

(22) Filed: Oct. 13, 2006

(65) Prior Publication Data

US 2007/0086234 A1   Apr. 19, 2007

Related U.S. Application Data

(60) Provisional application No. 60/727,321, filed on Oct. 17, 2005.

(51) Int. Cl.
| | |
|---|---|
| G11C 11/14 | (2006.01) |
| G11C 11/15 | (2006.01) |
| G11C 11/02 | (2006.01) |
| G11C 5/06 | (2006.01) |
| G11C 5/08 | (2006.01) |

(52) U.S. Cl. ............... 365/158; 365/171; 365/173; 365/131; 365/133; 365/66

(58) Field of Classification Search ............... 365/131, 365/133, 158, 171, 173, 66, 63, 243.5, 225.5, 365/187, 188
See application file for complete search history.

(56) References Cited

U.S. PATENT DOCUMENTS

| | | | | | |
|---|---|---|---|---|---|
| 5,565,695 | A | * | 10/1996 | Johnson | 257/295 |
| 6,130,814 | A | * | 10/2000 | Sun | 361/143 |
| 2006/0054931 | A1 | * | 3/2006 | Huang et al. | 257/197 |
| 2007/0085569 | A1 | * | 4/2007 | Agan et al. | 326/104 |
| 2007/0086104 | A1 | * | 4/2007 | Agan et al. | 360/46 |
| 2007/0097588 | A1 | * | 5/2007 | Agan et al. | 361/143 |
| 2007/0103196 | A1 | * | 5/2007 | Agan et al. | 326/52 |

* cited by examiner

*Primary Examiner*—J. H. Hur
(74) *Attorney, Agent, or Firm*—Thomas, Kayden, Horstemeyer & Risley

(57) ABSTRACT

A magnetic memory has a first, a second and a third magnetic transistor. The first magnetic transistor has a first magnetic section and a second magnetic section, wherein the first magnetic section couples to a high voltage end. The second magnetic transistor has a third magnetic section and a fourth magnetic section, wherein the third magnetic section couples to a low voltage end, and the fourth magnetic section couples to the second magnetic section of the first magnetic transistor. The third magnetic transistor has a fifth magnetic section and a sixth magnetic section, wherein the fifth magnetic section couples with the second magnetic section and the fourth magnetic section together, and the sixth magnetic section couples to an input/output end.

21 Claims, 6 Drawing Sheets

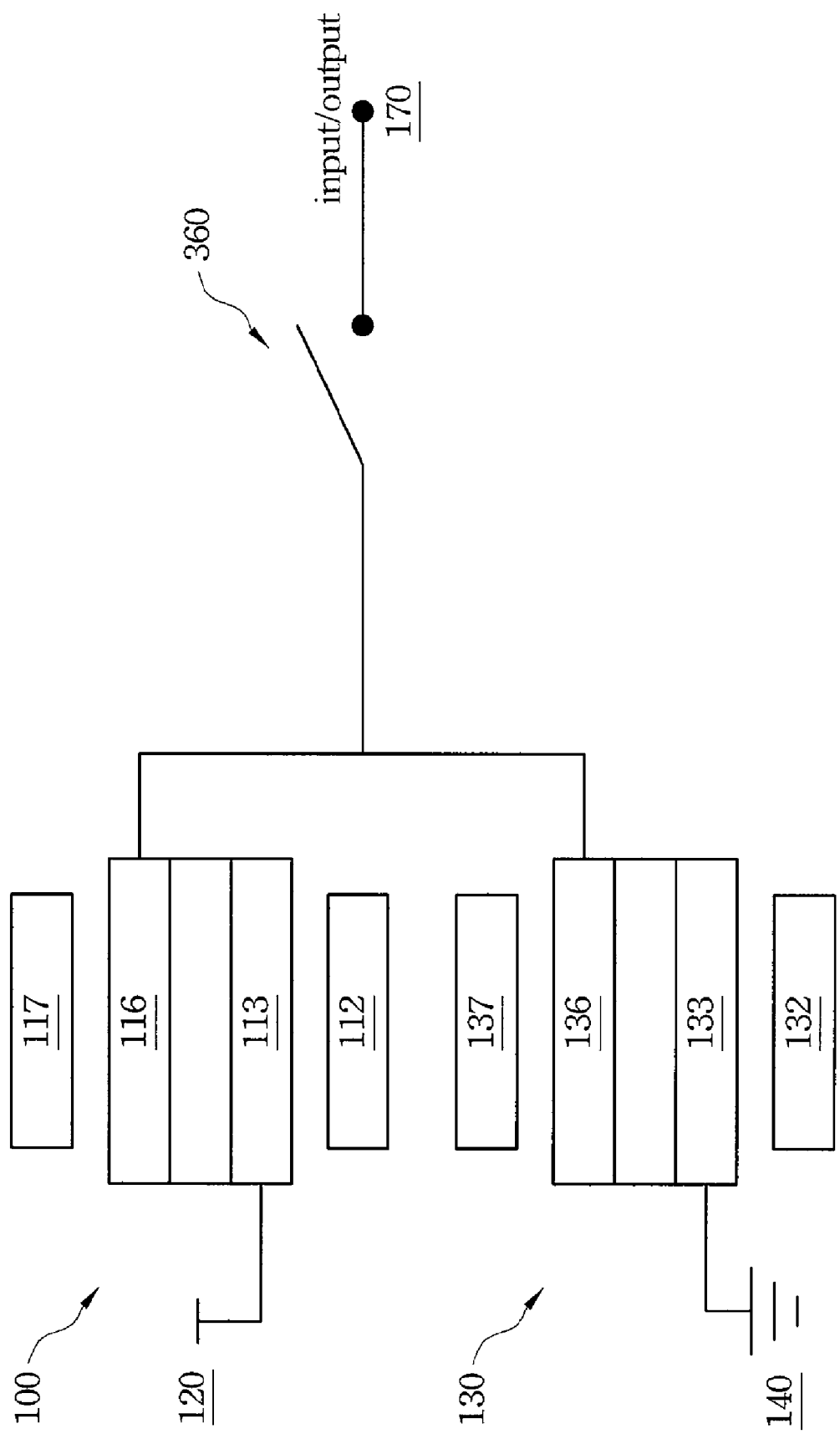

MAGNETIC MEMORY

CROSS-REFERENCE TO RELATED APPLICATION

This application claims the priority benefit of provisional application Ser. No. 60/727,321, filed on Oct. 17, 2005, the full disclosure of which is incorporated herein by reference.

BACKGROUND

1. Field of Invention

The present invention relates to a memory. More particularly, the present invention relates to a memory configured by several magnetic transistors.

2. Description of Related Art

Memory devices are used abundantly in our daily lives, and therefore memory devices have become important consumer electronics components. Computers, mobile phones and MP3 players all use memory devices. Ordinary memory devices are implemented with semiconductor transistors that need expensive processing and equipment to manufacture and design.

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

Therefore, the GMR effect can be used to design the magnetic transistor. Thus, magnetic transistors can further be used to integrate a magnetic memory without the expensive process and equipment. The magnetic memory can be designed and manufactured with short programming time and high density.

For the foregoing reasons, there is a need to have a magnetic memory integrated by magnetic transistors.

SUMMARY

It is therefore an aspect of the present invention to provide a memory device implemented by magnetic transistors.

According to one preferred embodiment of the present invention, the magnetic memory has a first, a second and a third magnetic transistor. The first magnetic transistor has a first magnetic section and a second magnetic section, wherein the first magnetic section couples to a high voltage end. The second magnetic transistor has a third magnetic section and a fourth magnetic section, wherein the third magnetic section couples to a low voltage end, and the fourth magnetic section couples to the second magnetic section of the first magnetic transistor. The third magnetic transistor has a fifth magnetic section and a sixth magnetic section, wherein the fifth magnetic section couples with the second magnetic section and the fourth magnetic section together, and the sixth magnetic section couples to an input/output end.

According to another preferred embodiment of the present invention, the magnetic memory has a first transistor, a second transistor, and a switch. The first magnetic transistor has a first magnetic section and a second magnetic section, wherein the first magnetic section couples to a high voltage end. The second magnetic transistor has a third magnetic section and a fourth magnetic section, wherein the third magnetic section couples to a low voltage end, and the fourth magnetic section couples to the second magnetic section of the first magnetic transistor. The switch has one end coupled with the second magnetic section and the fourth magnetic section together, and has another end coupled to an input/output end.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3 another magnetic memory according to another embodiment of this invention.

DESCRIPTION OF THE PREFERRED EMBODIMENTS

Figure 1:
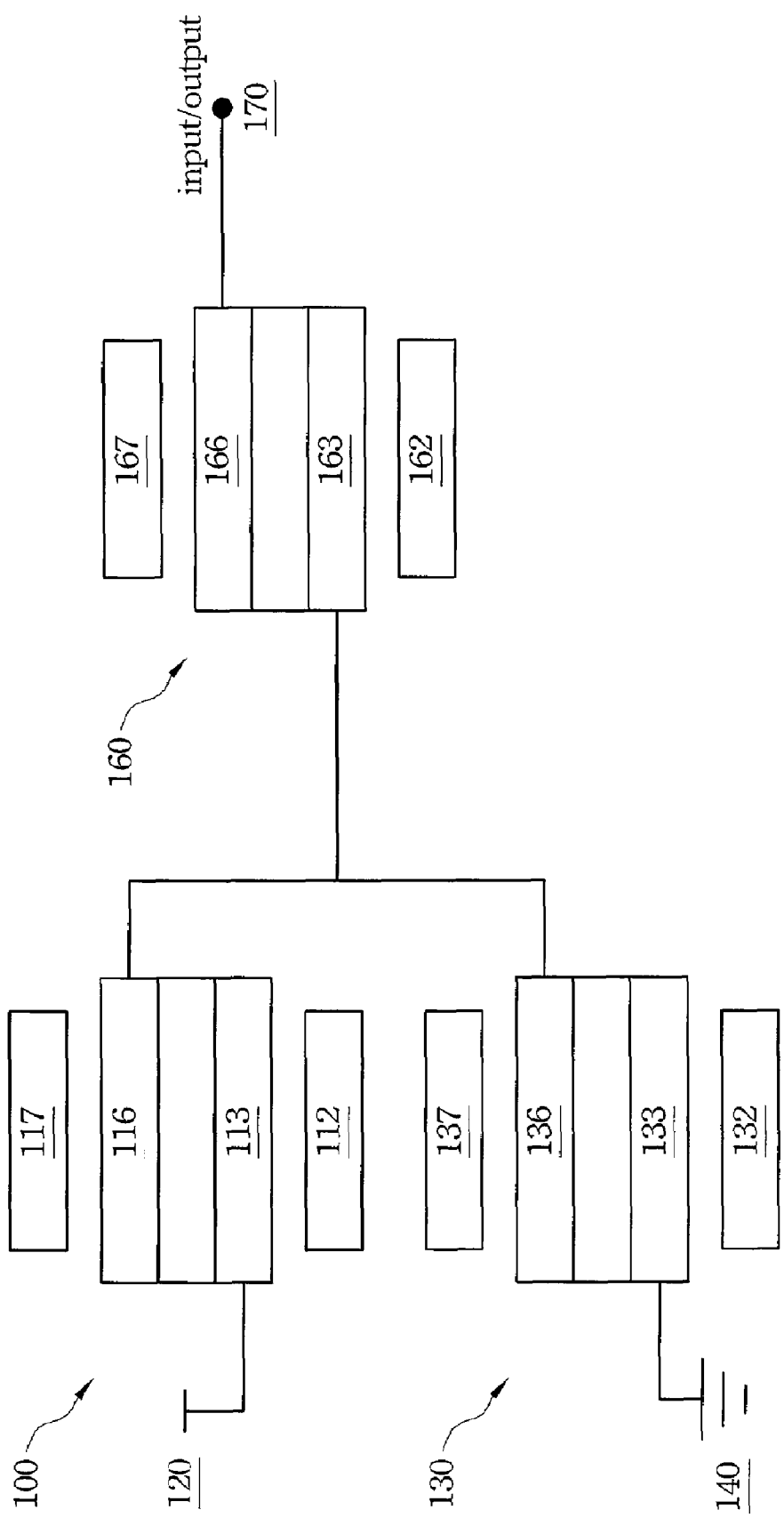
FIG. 1 is a magnetic memory according to an embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

FIG. 1 is a magnetic memory according to an embodiment of this invention. The magnetic memory has a first magnetic transistor 100, a second magnetic transistor 130, and a third magnetic transistor 160. The first magnetic transistor 100 has a first magnetic section 113 and a second magnetic section 116, wherein the first magnetic section 113 couples to a high voltage end 120. The second magnetic transistor 130 has a third magnetic section 133 and a fourth magnetic section 136, wherein the third magnetic section 133 couples to a low voltage end 140, and the fourth magnetic section 136 couples to the second magnetic section 116 of the first magnetic transistor 100. The third magnetic transistor 160 has a fifth magnetic section 163 and a sixth magnetic section 166, wherein the fifth magnetic section 163 couples with the second magnetic section 116 and the fourth magnetic section 136 together, and the sixth magnetic section 166 couples to an input/output end 170.

The magnetic memory further comprises a plurality of metal devices 112, 117, 132, 137, 162 and 167 respectively disposed around the magnetic sections 113, 116, 133, 136, 163 and 166, wherein the metal devices 112, 117, 132, 137, 162 and 167 are arranged to respectively control dipoles of the magnetic sections 113, 116, 133, 136, 163 and 166. For example, the first magnetic transistor 100 has metal devices 112 and 117 respectively disposed around the magnetic sections 113 and 116. The metal device 112 is arranged to control the dipole of the magnetic section 113, and the metal device 117 is arranged to control dipole of the magnetic section 116.

By the description above, the designer can use the metal devices to control the dipoles of the magnetic sections. The designer can further use the dipoles of these two magnetic sections of one magnetic transistor to control the conductivity between their selves.

For example, when dipoles of the first magnetic section 113 and the second magnetic section 116 are the same, the first magnetic section 113 and the second magnetic section 116 are conductive, when dipoles of the first magnetic section 113 and the second magnetic section 116 are different, the first magnetic section 113 and the second magnetic section 116 are not conductive.

When dipoles of the third magnetic section 133 and the fourth magnetic section 136 are the same, the third magnetic section 133 and the fourth magnetic section 136 are conductive, when dipoles of the third magnetic section 133 and the fourth magnetic section 136 are different, the third magnetic section 133 and the fourth magnetic section 136 are not conductive.

When dipoles of the fifth magnetic section 163 and the sixth magnetic section 166 are the same, the fifth magnetic section 163 and the sixth magnetic section 166 are conductive, when dipoles of the fifth magnetic section 163 and the sixth magnetic section 166 are different, the fifth magnetic section 163 and the sixth magnetic section 166 are not conductive.

Figure 2A:
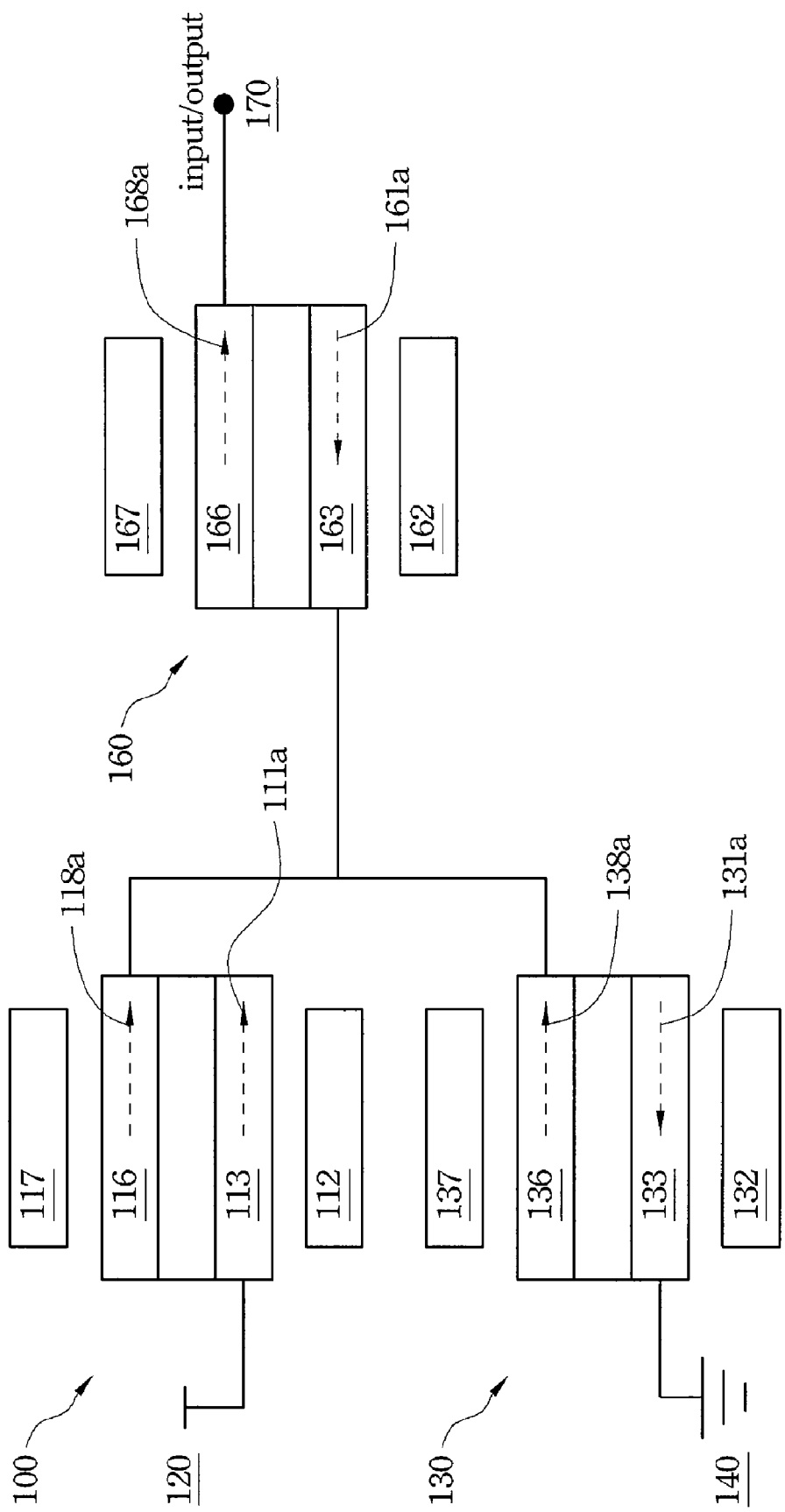
FIG. 2A is the magnetic memory under a storage state according to the embodiment of this invention.

FIG. 2A is the magnetic memory under a storage state according to the embodiment of this invention. When the magnetic memory is under a storage state, dipoles of the fifth magnetic section 163 and the sixth magnetic section 166 (arrows 161a and 168a) are different to make the fifth magnetic section 163 and the sixth magnetic section 166 non conductive. When the magnetic memory stores data '1' of the binary system, dipoles of the first magnetic section 113 and the second magnetic section 116 (arrows 111a and 118a) are the same, and dipoles of the third magnetic section 133 and the fourth magnetic section 136 (arrows 131a and 138a) are different.

The function of the first magnetic transistor 100 and the second magnetic transistor 130 can be seen as one bit of the ordinary memory. The third magnetic transistor 160 can be seen as a decoder or a switch of the ordinary memory.

Figure 2B:
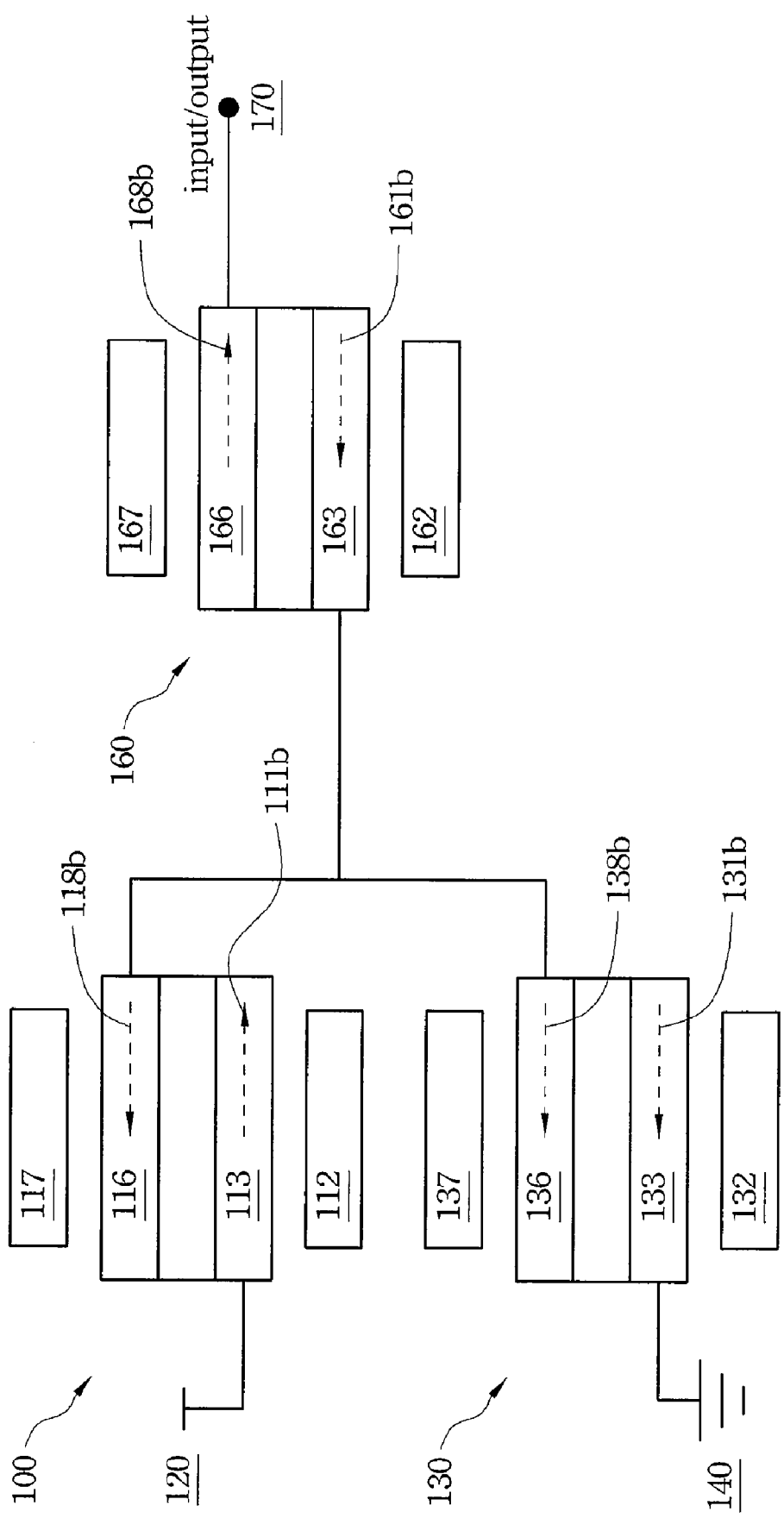
FIG. 2B is the magnetic memory under another storage state according to the embodiment of this invention.

FIG. 2B is the magnetic memory under another storage state according to the embodiment of this invention. When the magnetic memory stores data '0' of the binary system, dipoles of the fifth magnetic section 163 and the sixth magnetic section 166 (arrows 161b and 168b) are different, dipoles of the first magnetic section 113 and the second magnetic section 116 (arrows 111b and 118b) are different, and dipoles of the third magnetic section 133 and the fourth magnetic section 136 (arrows 131b and 138b) are the same.

Figure 2C:
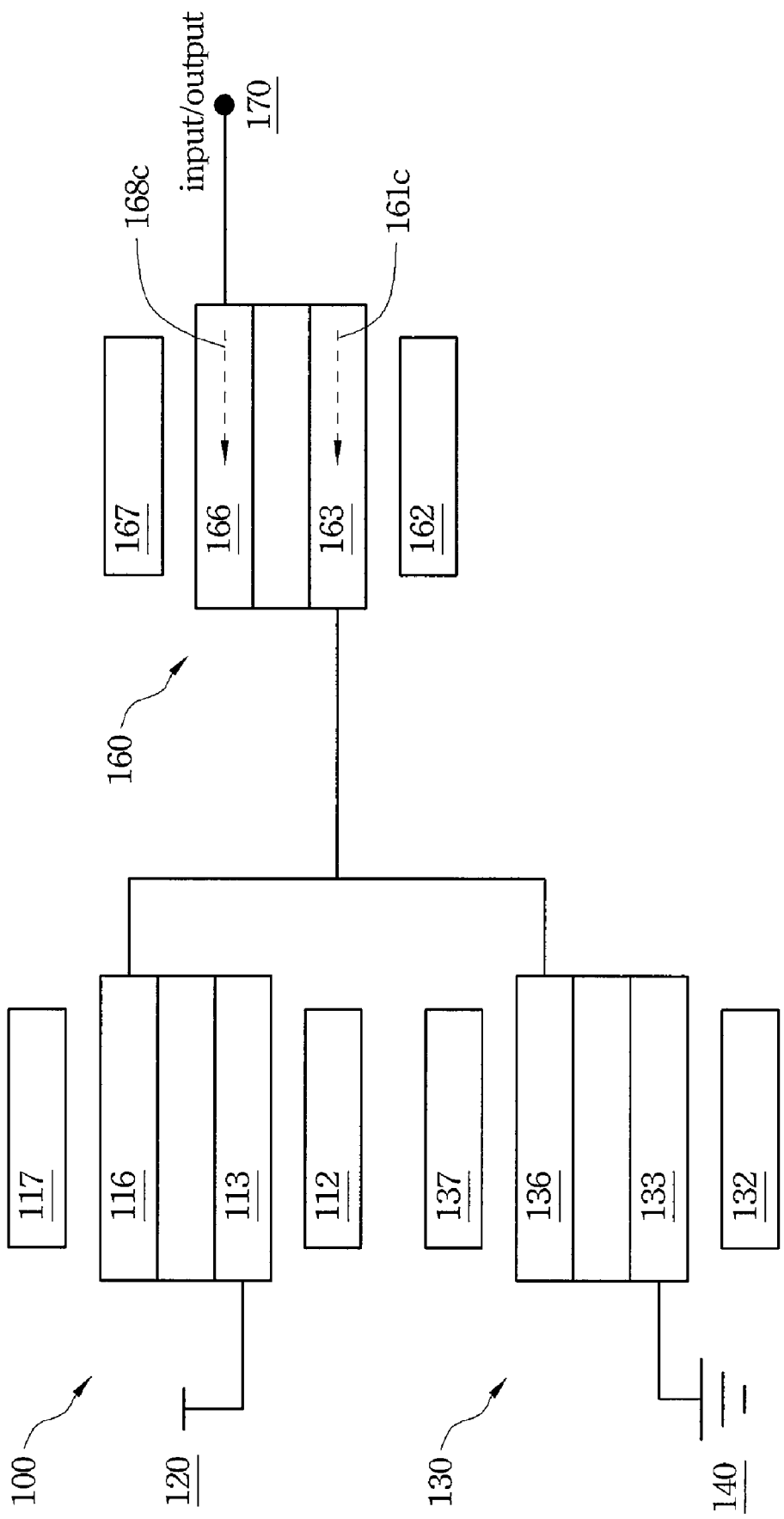
FIG. 2C is the magnetic memory under a read enable state according to the embodiment of this invention.

FIG. 2C is the magnetic memory under a read enable state according to the embodiment of this invention. When the magnetic memory is under a reading state, dipoles (arrows 161c and 168c) of the fifth magnetic section 163 and the sixth magnetic section 166 are the same to make data outputted from the first magnetic transistor 100 or the second magnetic transistor 130 to the input/output end 170.

On the other hand, when the magnetic memory is read disable, dipoles of the fifth magnetic section 163 and the sixth magnetic section 166 are different to prevent data from outputting to the input/output end 170.

Figure 2D:
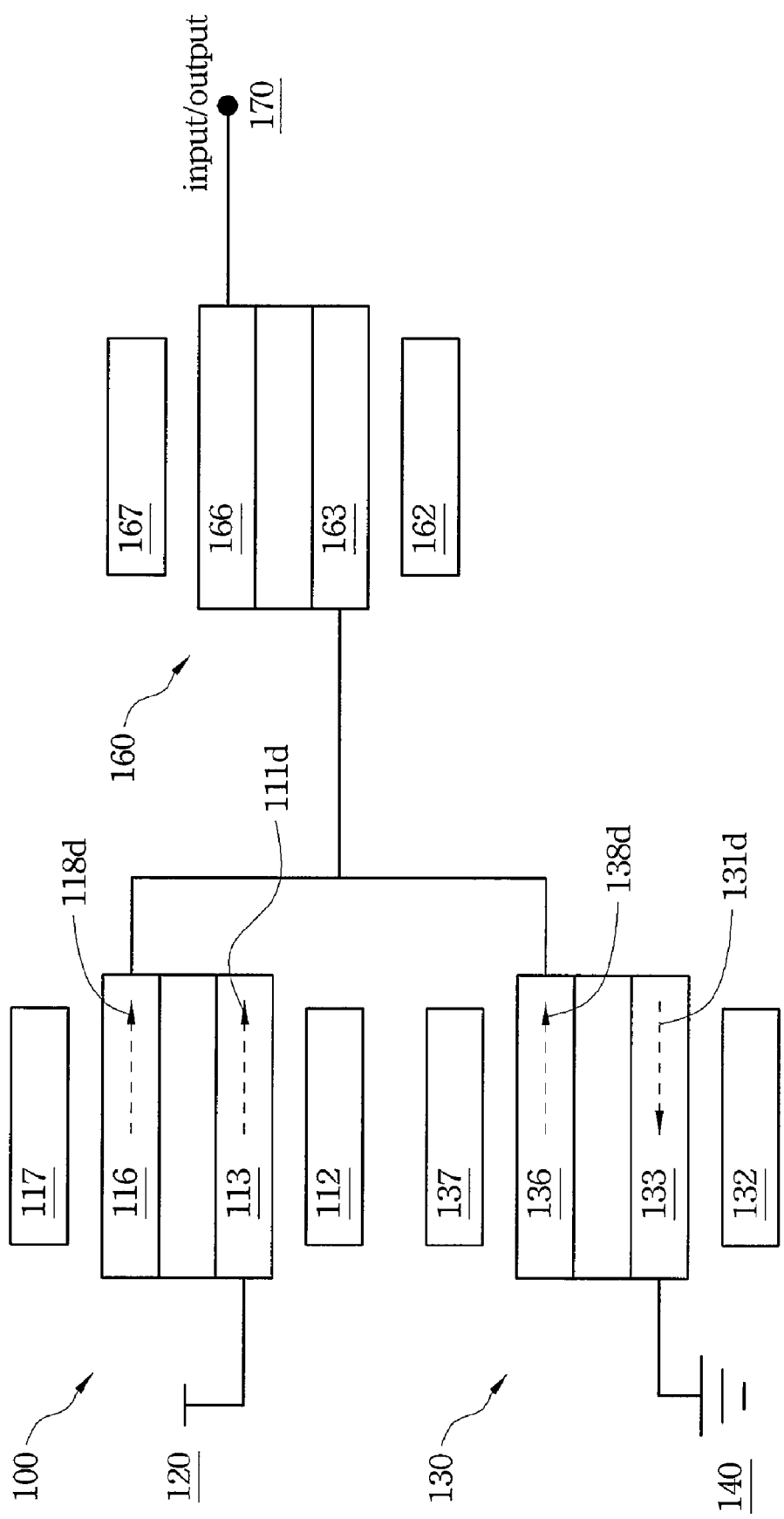
FIG. 2D is the magnetic memory under a writing state according to the embodiment of this invention.

FIG. 2D is the magnetic memory under a writing state according to the embodiment of this invention. When the magnetic memory is under a writing state, dipoles of the first magnetic section 113, the second magnetic section 116, the third magnetic section 133 and the fourth magnetic section 136 are arranged to decide what data must be written in the magnetic memory. For example, when dipoles of the first magnetic section 113 and the second magnetic section 116 (arrows 111d and 118d) are the same, and dipoles of the third magnetic section 133 and the fourth magnetic section 136 (arrows 131d and 138d) are different, the magnetic memory is written the data '1'.

FIG. 3 is another magnetic memory according to another embodiment of this invention. The difference between FIG. 3 and FIG. 1 is that the switch 360 replaces the third magnetic transistor 160. The switch 360 has one end coupled with the second magnetic section 116 and the fourth magnetic section 136 together, and has another end coupled to the input/output end 170. The switch 360 can be implemented as a traditional transistor.

In order to corporate with the ordinary integrated circuits of semiconductor, a voltage of the low voltage end 140 is about 0 volt, and a voltage of the high voltage end 220 is about 2.5 volt, 3.3 volt or 5 volt.

The symbols '→' and '←' here are just arranged to respectively represent the dipoles of the magnetic sections, not arranged to restrict the dipole directions. In the magnetic transistor circuit, each magnetic transistor has a conductive section between two magnetic sections. The conductivity of the conductive section can be controlled by the dipoles of these two magnetic sections. Therefore, the magnetic memory can be implemented by the description above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic memory, comprising:
    a first magnetic transistor having a first magnetic section and a second magnetic section, wherein the first magnetic section couples to a high voltage end;
    a second magnetic transistor having a third magnetic section and a fourth magnetic section, wherein the third magnetic section couples to a low voltage end, and the fourth magnetic section couples to the second magnetic section of the first magnetic transistor; and
    a third magnetic transistor having a fifth magnetic section and a sixth magnetic section, wherein the fifth magnetic section couples with the second magnetic section and the fourth magnetic section together, and the sixth magnetic section couples to an input/output end.

2. The magnetic memory of claim 1, further comprising a plurality of metal devices respectively disposed around the magnetic sections, wherein the metal devices are arranged to respectively control dipoles of the magnetic sections.

3. The magnetic memory of claim 1, wherein when dipoles of the first magnetic section and the second magnetic section are the same, the first magnetic section and the second magnetic section are conductive, when dipoles of the first magnetic section and the second magnetic section are different, the first magnetic section and the second magnetic section are not conductive.

4. The magnetic memory of claim 1, wherein when dipoles of the third magnetic section and the fourth magnetic section are the same, the third magnetic section and the fourth magnetic section are conductive, when dipoles of the third magnetic section and the fourth magnetic section are different, the third magnetic section and the fourth magnetic section are not conductive.

5. The magnetic memory of claim 1, wherein when dipoles of the fifth magnetic section and the sixth magnetic section are the same, the fifth magnetic section and the sixth magnetic section are conductive, when dipoles of the fifth magnetic section and the sixth magnetic section are different, the fifth magnetic section and the sixth magnetic section are not conductive.

6. The magnetic memory of claim 1, wherein when the magnetic memory is under a storage state, dipoles of the fifth magnetic section and the sixth magnetic section are different.

7. The magnetic memory of claim 6, wherein when the magnetic memory stores data '1' of the binary system, dipoles of the first magnetic section and the second magnetic section are the same, and dipoles of the third magnetic section and the fourth magnetic section are different.

8. The magnetic memory of claim 6, wherein when the magnetic memory stores data '0' of the binary system, dipoles of the first magnetic section and the second magnetic section are different, and dipoles of the third magnetic section and the fourth magnetic section are the same.

9. The magnetic memory of claim 1, wherein when the magnetic memory is under a reading state, dipoles of the fifth magnetic section and the sixth magnetic section are the same to make data outputted from the first magnetic transistor or the second magnetic transistor to the input/output end.

10. The magnetic memory of claim 1, wherein when the magnetic memory is under a writing state, dipoles of the first magnetic section, the second magnetic section, the third magnetic section and the fourth magnetic section are arranged to select the data written in the magnetic memory.

11. A magnetic memory, comprising:
a first magnetic transistor having a first magnetic section and a second magnetic section, wherein the first magnetic section couples to a high voltage end;
a second magnetic transistor having a third magnetic section and a fourth magnetic section, wherein the third magnetic section couples to a low voltage end, and the fourth magnetic section couples to the second magnetic section of the first magnetic transistor; and
a switch having one end coupling with the second magnetic section and the fourth magnetic section together, and having another end coupling to an input/output end.

12. The magnetic memory of claim 11, further comprising a plurality of metal devices respectively disposed around the magnetic sections, wherein the metal devices are arranged to respectively control dipoles of the magnetic sections.

13. The magnetic memory of claim 11, wherein when dipoles of the first magnetic section and the second magnetic section are the same, the first magnetic section and the second magnetic section are conductive, when dipoles of the first magnetic section and the second magnetic section are different, the first magnetic section and the second magnetic section are not conductive.

14. The magnetic memory of claim 11, wherein when dipoles of the third magnetic section and the fourth magnetic section are the same, the third magnetic section and the fourth magnetic section are conductive, when dipoles of the third magnetic section and the fourth magnetic section are different, the third magnetic section and the fourth magnetic section are not conductive.

15. The magnetic memory of claim 11, wherein the switch is a transistor.

16. The magnetic memory of claim 11, wherein the switch is a third magnetic transistor having a fifth magnetic section and a sixth magnetic section, the fifth magnetic section couples with the second magnetic section and the fourth magnetic section together, and the sixth magnetic section couples to the input/output end.

17. The magnetic memory of claim 11, wherein when the magnetic memory is under a storage state, the switch is turned off.

18. The magnetic memory of claim 17, wherein when the magnetic memory stores data '1' of the binary system, dipoles of the first magnetic section and the second magnetic section are the same, and dipoles of the third magnetic section and the fourth magnetic section are different.

19. The magnetic memory of claim 17, wherein when the magnetic memory stores data '0' of the binary system, dipoles of the first magnetic section and the second magnetic section are different, and dipoles of the third magnetic section and the fourth magnetic section are the same.

20. The magnetic memory of claim 11, wherein when the magnetic memory is under a reading state, the switch is turned on to make data outputted from the first magnetic transistor or the second magnetic transistor to the input/output end.

21. The magnetic memory of claim 11, wherein when the magnetic memory is under a writing state, dipoles of the first magnetic section, the second magnetic section, the third magnetic section and the fourth magnetic section are arranged to select the data written in the magnetic memory.

* * * * *